United States Patent
Lee et al.

(10) Patent No.: US 7,482,845 B2
(45) Date of Patent: Jan. 27, 2009

(54) OUTPUT BUFFER CIRCUIT

(75) Inventors: Youn Joong Lee, Seoul (KR); Won Tae Choi, Yongin (KR); Chan Woo Park, Ansan (KR); Byung Hoon Kim, Seoul (KR)

(73) Assignee: Samsung Electro-Mechanics Co., Ltd., Suwon-Si, Gyunggi-Do (KR)

( * ) Notice: Subject to any disclaimer, the term of this patent is extended or adjusted under 35 U.S.C. 154(b) by 0 days.

(21) Appl. No.: 11/469,219

(22) Filed: Aug. 31, 2006

(65) Prior Publication Data

US 2007/0080723 A1   Apr. 12, 2007

(30) Foreign Application Priority Data

Oct. 6, 2005   (KR) .............. 10-2005-0093710
Jul. 20, 2006   (KR) .............. 10-2006-0067893

(51) Int. Cl.
*H03B 1/00* (2006.01)
(52) U.S. Cl. .............. 327/112; 327/170; 327/381; 326/82; 326/83
(58) Field of Classification Search .............. None
See application file for complete search history.

(56) References Cited

U.S. PATENT DOCUMENTS

| | | | | |
|---|---|---|---|---|
| 5,469,096 A | * | 11/1995 | Nessi et al. | 327/112 |
| 5,587,678 A | * | 12/1996 | Dijkmans | 327/108 |
| 5,872,473 A | * | 2/1999 | Williams | 327/108 |
| 5,949,259 A | * | 9/1999 | Garcia | 327/111 |
| 5,973,512 A | | 10/1999 | Baker | |
| 6,281,730 B1 | | 8/2001 | Vu | |
| 6,670,941 B2 | | 12/2003 | Albu et al. | |
| 6,876,235 B2 | * | 4/2005 | Li et al. | 327/112 |
| 7,199,613 B2 | * | 4/2007 | Chauhan et al. | 326/81 |
| 7,295,047 B2 | * | 11/2007 | Lee et al. | 327/108 |
| 2006/0091955 A1 | * | 5/2006 | Choi | 330/260 |

FOREIGN PATENT DOCUMENTS

| | | |
|---|---|---|
| KR | 10-2004-0084000 A | 6/2004 |
| KR | 10-2004-0057491 A | 7/2004 |
| KR | 10-2004-0039895 A | 12/2004 |

OTHER PUBLICATIONS

Korean Patent Office Notice of Allowance, issued Mar. 18, 2008.

* cited by examiner

*Primary Examiner*—An T Luu
(74) *Attorney, Agent, or Firm*—Lowe Hauptman Ham & Berner

(57) ABSTRACT

Provided is an output buffer circuit having a slew rate increasing part configured with a switching element. The output buffer circuit can obtain an output voltage having a high slew rate even though a smaller amount of a bias current than that required in a conventional output buffer is used. Therefore, the output buffer circuit can reduce power consumption. In the output buffer circuit with a compensation capacitive load, an input part has two input terminal receiving differential input voltage signals, and an output part increases a gain of the differential input voltages. A current source biases the output part, and a slew rate increasing part is connected to the output part and the compensation capacitive load. The slew rate increasing part includes a switching element to increase a slew rate of the output buffer circuit.

12 Claims, 3 Drawing Sheets

[FIG. 1]
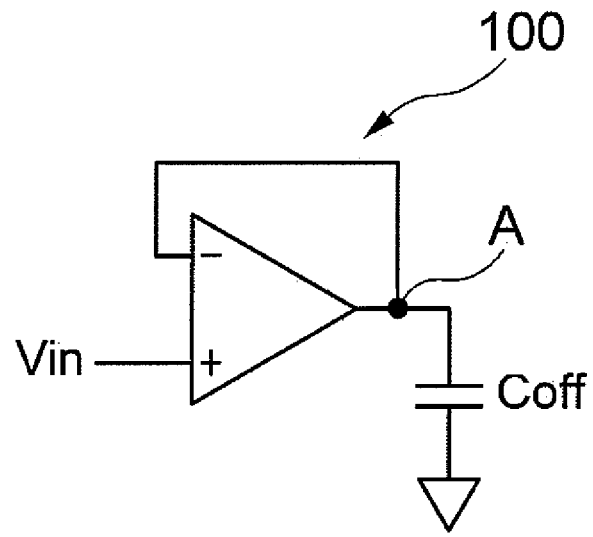
- Prior Art -
[FIG. 2]
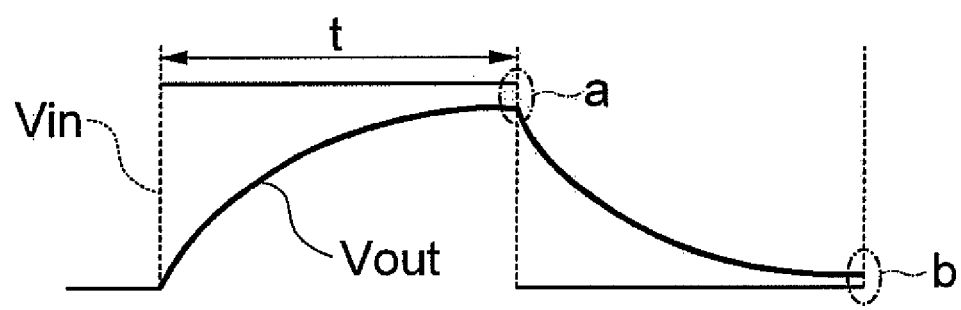
- Prior Art -

[FIG. 3]
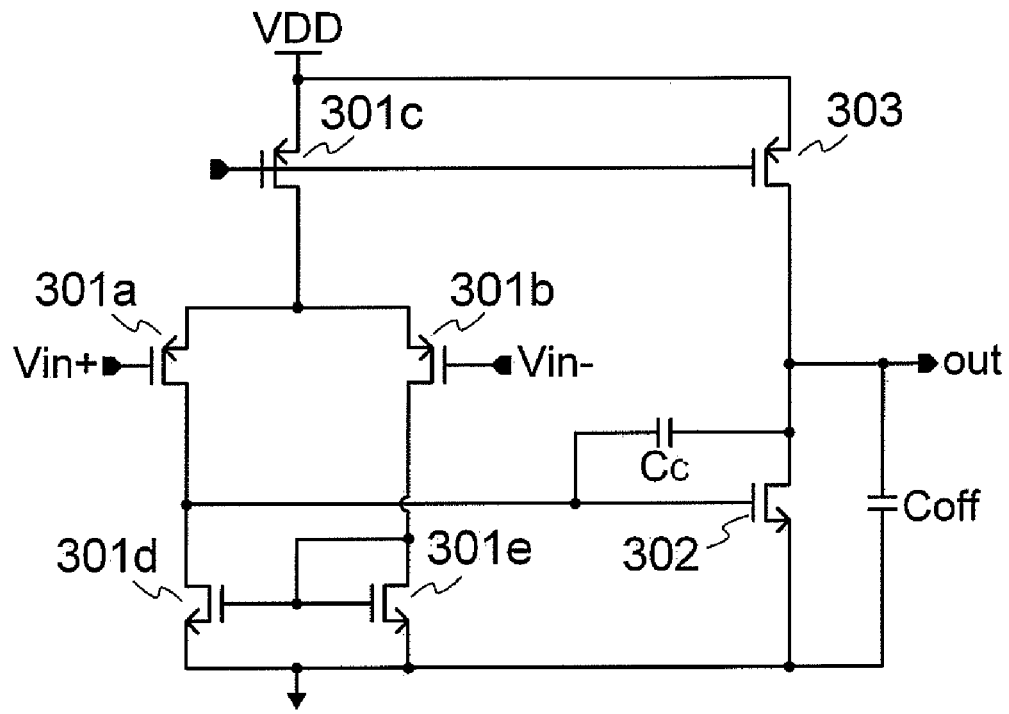
- Prior Art -
[FIG. 5]
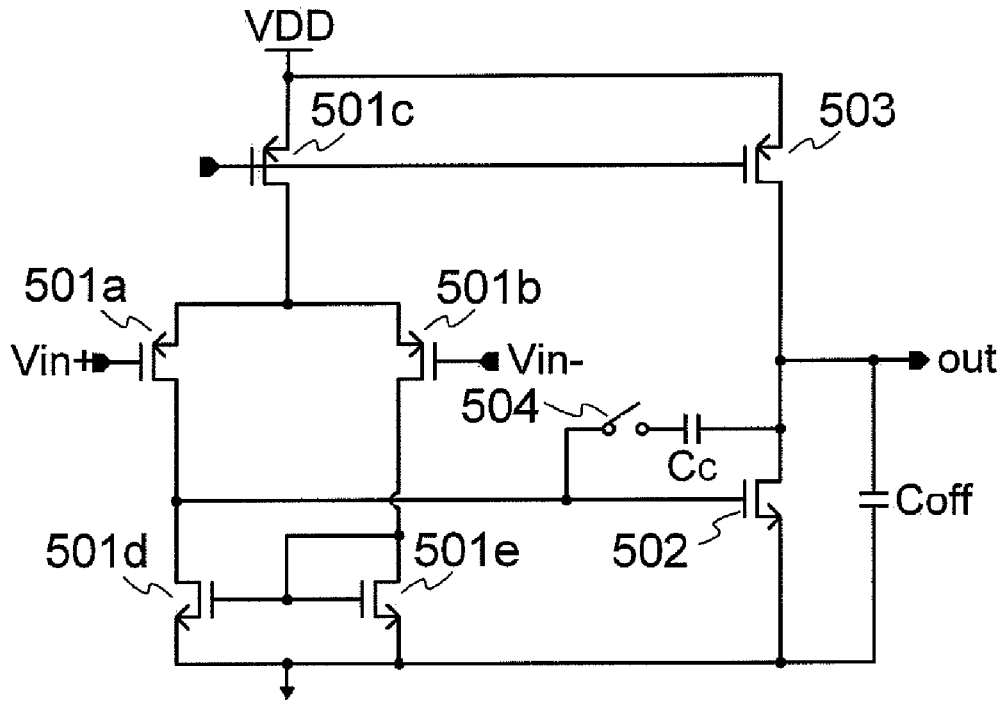

[FIG. 4]
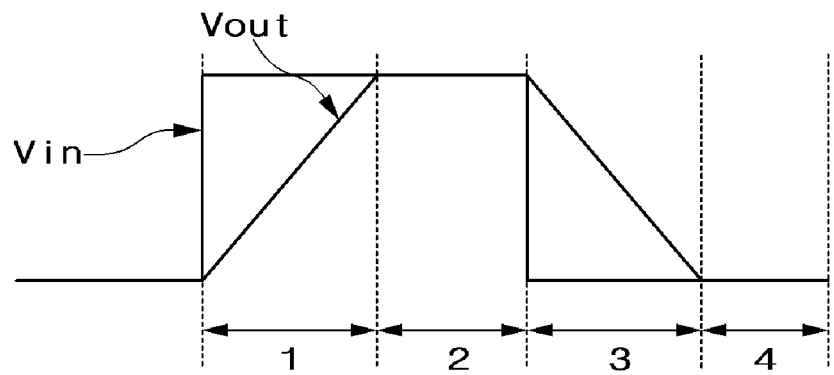
[FIG. 6]
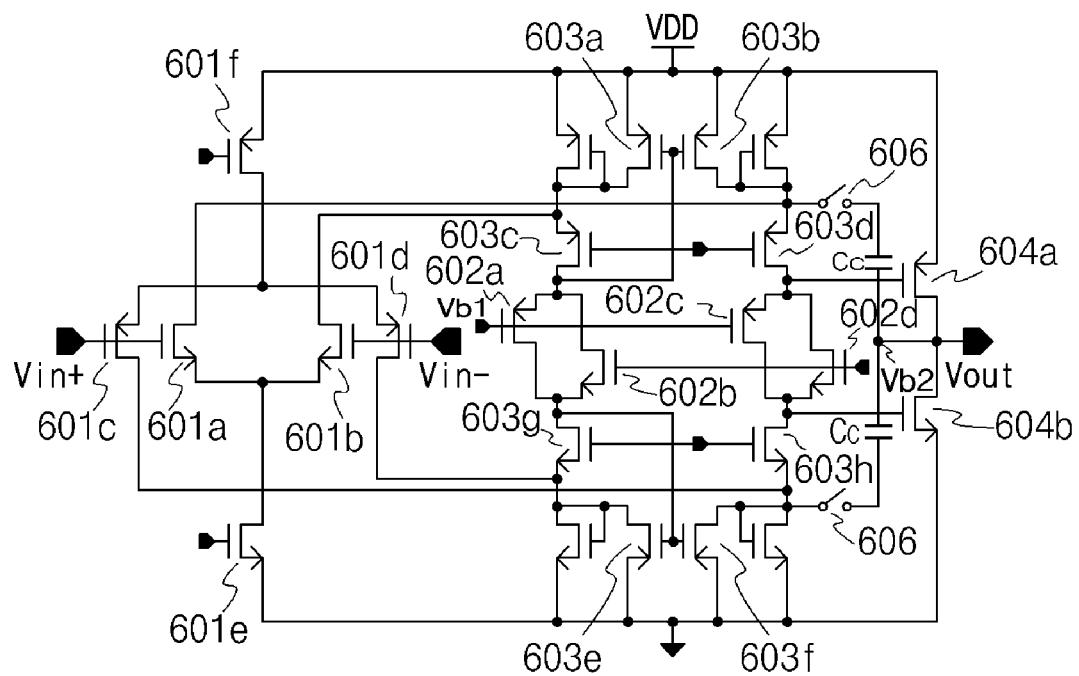

OUTPUT BUFFER CIRCUIT

CROSS-REFERENCE TO RELATED APPLICATIONS

The present application is based on, and claims priority from, Korean Application No. 10-2005-003-93710, filed Oct. 6, 2005 and Korean Application No. 10-2006-0067893, filed Jul. 20, 2006, the disclosures of which are hereby incorporated by reference herein in their entirety.

BACKGROUND OF THE INVENTION

1. Field of the Invention

The present invention relates to an output buffer circuit having a slew rate increasing part configured with a switching element. The output buffer circuit can obtain an output voltage having a high slew rate even though a smaller amount of a bias current than that required in a conventional output buffer is used. Therefore, the output buffer circuit can reduce power consumption.

2. Description of the Related Art

In general, display fields are considered as high technology fields that are promising in electronic industries. A lot of liquid crystal displays (LCDs) and plasma display panels (PDPs) have been manufactured.

As the next generation technologies, various kinds of displays devices are actively under development. Among them, spatial optical modulators (SOMs) are being most actively developed. Even though SOM driver ICs have the output resolution of 8 bits, it is expected that they will have the output resolution of 10 bits or more in the near future. Therefore, there is a demand for a high-speed and high-precision driver IC that can drive the SOM driver ICs having the output resolution of 10 bits or more.

A high slew rate is required to maintain high-speed and high-precision characteristic. The slew rate means a rising variation of an output signal per unit time with respect to a step variation of a control input signal. Thus, a driver IC having a high slew rate is required to transfer an image signal more accurately in a predefined data transfer time.

FIG. 1 is a circuit diagram of a modeled output buffer 100 according to the related art, and FIG. 2 is a waveform diagram of an input voltage signal and an output voltage signal according to the related art.

Referring to FIGS. 1 and 2, the output buffer 100 according to the related art can be modeled with a large-capacity capacitor Coff of 50 pF or more.

However, when the slew rate of the output buffer 100 is low, the capacitor Coff is not fully charged during a predefined data transfer time t, so that an image signal is delayed. Consequently, the image signal cannot be accurately transferred in the predefined data transfer time t.

As illustrated in FIG. 2, in the case of the output buffer with a low slew rate, when an upslewing input signal is applied during the predefined data transfer time t, an output image signal (a) does not have a predetermined amplitude. Likewise, when a downslewing input signal is applied, an output image signal (b) does not have a predetermined amplitude.

To solve this problem, the slew rate of the output buffer should be improved. If the slew rate of the circuit increases, the output voltage becomes a little higher when the upslewing input signal is applied. On the other hand, the output voltage becomes a little lower when the downslewing input signal is applied. Therefore, the image signal can be transferred more accurately in the predefined data transfer time t.

FIG. 3 is a circuit diagram of an output buffer circuit according to the related art. Referring to FIG. 3, the output buffer circuit according to the related art includes a compensation capacitive load $C_C$, an input part 301a-301e, an output part 302, and a current source 303.

Differential input voltage signals are applied to two input terminals of the input part 301a to 301e.

The differential input voltage means a difference between voltages applied to the two input terminals. The output buffer circuit according to the related art employs a differential input circuit scheme that operates only in response to the difference between the voltages applied to the two input terminals.

In addition, the output part 302 increases a gain of the differential input voltages and the current source 303 biases the output part 302.

A slewing operation of the output buffer circuit according to the related art will be described below with reference to FIG. 3.

In FIG. 3, $I_{SS}$ is a bias current of the input part 301a-301e, $I_P$ is a current that is biased through the current source 303 to the output part 302, and $g_m$ is a mutual conductance of a MOS transistor. When the differential input voltage applied to the input part 301a-301e is more than $I_{SS}/g_m$, that is, when the slewing differential input voltage is applied, some transistors of the input part 301a-301e are turned on, and some transistors are turned off. Therefore, $I_{SS}$ flows only through some transistors.

The above-described operations are divided into two cases: the first case where the upslewing input voltage is applied, and the second case where the downslewing input voltage is applied.

When the upslewing input voltage is applied, that is, when a gate voltage of the first PMOS transistor 301a is higher than that of the second PMOS transistor 301b by more than $I_{SS}/g_m$, only the second PMOS transistor 301b is turned on, so that $I_{SS}$ flows only through the second PMOS transistor 301b.

Therefore, $I_{SS}$ flows through the second NMOS transistor 301e connected to the second PMOS transistor 301b. Because the magnitude of the current biased through the current source 303 to the output part 302 is fixed to $I_P$, $I_{SS}$ is supplied through the discharge of the compensation capacitive load $C_C$. Thus, $I_{SS}$ also flows through the first NMOS transistor 301d, which has a mirror relationship with the second PMOS transistor 301e.

$I_{SS}$ flows through the ground of the first NMOS transistor 301d, so that a drain voltage of the first NMOS transistor 301d is dropped. Consequently, the drain voltage of the output part 302 is increased and the voltage of the output terminal "out" is increased.

When the downslewing input voltage is applied, that is, when the gate voltage of the first PMOS transistor 301a is lower than that of the second PMOS transistor 301b by more than $I_{SS}/g_m$, only the first PMOS transistor 301a is turned on, so that $I_{SS}$ flows only through the first PMOS transistor 301a.

Therefore, $I_{SS}$ does not flow through the second NMOS transistor 301e, and $I_{SS}$ does not flow through the first NMOS transistor 301d, which has a mirror relationship with the second NMOS transistor 301e.

Because the magnitude of the current biased through the current source 303 to the output part 302 is fixed to $I_P$, $I_{SS}$ transferred through only the first PMOS transistor 301a is charged to the compensation capacitive load $C_C$.

Therefore, the drain voltage of the first NMOS transistor 301d is increased. Consequently, the drain voltage of the output part 302 is dropped and the voltage of the output terminal "out" is dropped.

However, when the slew rate is increased due to the high-speed and high-precision characteristics, the output buffer circuit according to the related art consumes much power. The reason is that the slew rate corresponds to the value given by dividing $I_{SS}$ by the capacitance of the compensation capacitive load $C_C$ and thus is proportional to $I_{SS}$, as expressed as Equation (1) below.

$$\text{Slew rate} = I_{SS}/C_C \tag{1}$$

That is, because the compensation capacitive load $C_C$ must be charged and discharged so as to increase the slew rate, a large amount of $I_{SS}$ should be used. Consequently, $I_{SS}$ having a sufficient magnitude has to flow through the circuit during all time when the input voltage is applied, as well as during the slewing, thus increasing the power consumption.

SUMMARY OF THE INVENTION

An advantage of the present invention is that it provides an output buffer circuit having a slew rate increasing part configured with a switching element. The output buffer circuit can obtain an output voltage having a high slew rate even though a smaller amount of a bias current than that required in a conventional output buffer is used. Therefore, the output buffer circuit can reduce power consumption.

Additional aspect and advantages of the present general inventive concept will be set forth in the description which follows and, in part, will be obvious from the description, or may be learned by practice of the general inventive concept.

According to an aspect of the invention, an output buffer circuit with a compensation capacitive load includes: an input part having two input terminal receiving differential input voltage signals; an output part increasing a gain of the differential input voltages; a current source biasing the output part; and a slew rate increasing part connected to the output part and the compensation capacitive load, the slew rate increasing part including a switching element to increase a slew rate of the output buffer circuit.

According to another aspect of the present invention, when the differential input voltages are upslewing differential input voltages, the input part includes: first and second PMOS transistors having gates receiving the upslewing differential input voltages; a third PMOS transistor biasing the first and second PMOS transistors; and first and second NMOS transistors converting a current generated by a difference between the upslewing differential input voltages into a voltage.

According to a further aspect of the present invention, the first PMOS transistor is turned off and the second PMOS transistor is turned on.

According to a still further aspect of the present invention, the slew rate increasing part turns off the switching element.

According to a still further aspect of the present invention, when the differential input voltages are downslewing differential input voltages, the input part includes: first and second PMOS transistors having gates receiving the downslewing differential input voltages; and a third PMOS transistor biasing the first and second PMOS transistors.

According to a still further aspect of the present invention, the first PMOS transistor is turned off and the second PMOS transistor is turned off.

According to a still further aspect of the present invention, the slew rate increasing part turns off the switching element.

According to a still further aspect of the present invention, when the differential input voltages are settling differential input voltages, the slew rate increasing part turns on the switching element.

According to a still further aspect of the present invention, an output buffer circuit with a compensation capacitive load includes: an input part having two input terminals receiving differential input voltage signals; an output part increasing a gain of the differential input voltages; a floating current source biasing the output part; a summing circuit connected to the input part and the floating current source, the summing circuit being configured to sum a current supplied from the input part and an internal current supplied from the floating current source; and a slew rate increasing part connected to the input part and the summing circuit, the slew rate increasing part including a plurality of switching elements to increase a slew rate of the output buffer circuit.

According to a still further aspect of the present invention, when the differential input voltages are upslewing differential input voltages, the input part includes: first and second NMOS transistors having gates receiving the upslewing differential input voltages; first and second PMOS transistors having gates receiving the upslewing differential input voltages; a third NMOS transistor biasing the first and second NMOS transistors; and a third PMOS transistor biasing the first and second PMOS transistors.

According to a still further aspect of the present invention, the first NMOS transistor and the second PMOS transistor are turned on, and the first PMOS transistor and the second NMOS transistor are turned off.

According to a still further aspect of the present invention, the slew rate increasing part turns off the switching element.

According to a still further aspect of the present invention, when the differential input voltages are downslewing differential input voltages, the input part includes: first and second NMOS transistors having gates receiving the downslewing differential input voltages; first and second PMOS transistors having gates receiving the downslewing differential input voltages; a third NMOS transistor biasing the first and second NMOS transistors; and a third PMOS transistor biasing the first and second PMOS transistors.

According to a still further aspect of the present invention, the first PMOS transistor and the second NMOS transistor are turned on, and the first NMOS transistor and the second PMOS transistor are turned off.

According to a still further aspect of the present invention, the slew rate increasing part turns off the switching element.

According to a still further aspect of the present invention, when the differential input voltages are settling differential input voltages, the slew rate increasing part turns on the switching element.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a circuit diagram of a modeled output buffer according to the related art;

FIG. 2 is a waveform diagram of an input voltage signal and an output voltage signal according to the related art;

FIG. 3 is a circuit diagram of an output buffer circuit according to the related art;

FIG. 4 is an operation timing diagram of an output buffer circuit according to the present invention;

FIG. 5 is a circuit diagram of an output buffer circuit according to a first embodiment of the present invention; and FIG. 6 is a circuit diagram of an output buffer circuit according to a second embodiment of the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

FIG. 4 is an operation timing diagram of an output buffer circuit according to the present invention. FIG. 5 is a circuit diagram of an output buffer circuit according to a first embodiment of the present invention. FIG. 6 is a circuit diagram of an output buffer circuit according to a second embodiment of the present invention.

Hereinafter, an output buffer circuit that can obtain a high slew rate using a small amount of a bias current according to the embodiments of the present invention will be described in detail with reference to the accompanying drawings.

Embodiment 1

Referring to FIG. 5, the output buffer circuit according to the first embodiment of the present invention includes a compensation capacitive load $C_C$, an input part 501a-501e, an output part 502, a current source 503, and a slew rate increasing part 504.

The input part 501a-501e has two input terminals receiving differential input voltage signals. The input part 501a-501e includes first and second PMOS transistors 501a and 501b having gates receiving the differential input voltages, a third PMOS transistor 501c biasing the first and second PMOS transistors 501a and 501b, and first and second NMOS transistors 501d and 501e converting a current generated according to a difference between the differential input voltages into a voltage.

The differential input voltage means a difference between voltages applied to the two input terminals. The output buffer circuit according to the first embodiment of the present invention employs a differential input circuit scheme that operates only in response to the difference between the voltages applied to the two input terminals.

The output part 502 increases a gain of the differential input voltages. The output part 502 may use several kinds of the output terminals, such as a class A type output terminal, a class B type output terminal, and a class AB type output terminal. Among them, it is preferable to use the class AB type output terminal that can secure linearity somewhat.

The current source 503 biases the output part 502. The slew rate increasing part 504 is connected to the output part 502 and the compensation capacitive load $C_C$ and is implemented with a switching element 504. The slew rate increasing part 504 increases the slew rate of the output buffer circuit.

The switching element 504 may be implemented using various elements. Among them, a transistor is widely used as the switching element 504.

A slewing operation of the output buffer circuit according to the first embodiment of the present invention will be described below with reference to FIGS. 4 and 5.

It will be assumed that $I_{SS}$ is a bias current of the input part 501a-501e, $I_P$ is a current that is biased through the current source 503 to the output part 502, and $g_m$ is a mutual conductance of a MOS transistor. When the differential input voltage applied to the input part 501a-501e is more than $I_{SS}/g_m$, that is, when the slewing differential input voltage is applied, some transistors of the input part 501a-501e are turned on, and some transistors are turned off. Therefore, $I_{SS}$ flows only through some transistors.

The above-described operations are divided into two cases: the first case where the upslewing input voltage is applied, and the second case where the downslewing input voltage is applied.

During a first period of FIG. 4, when the upslewing input voltage is applied, that is, when a gate voltage of the first PMOS transistor 501a is higher than that of the second PMOS transistor 501b by more than $I_{SS}/g_m$, only the second PMOS transistor 501b is turned on, so that $I_{SS}$ flows only through the second PMOS transistor 501b.

Therefore, $I_{SS}$ flows through the second NMOS transistor 501e connected to the second PMOS transistor 501b. An operation of supplying $I_{SS}$ to the first NMOS transistor 501d having a mirror relationship with the second NMOS transistor 501e will be described below.

When the upslewing input voltage is applied, the switching element 504 of the slew rate increasing part 504 is turned off, so that the compensation capacitive load $C_C$ is disconnected from the switching element 504.

At this point, because the magnitude of the current biased through the current source 503 to the output part 502 is fixed to $I_P$, $I_{SS}$ is supplied to the first NMOS transistor 501d by the discharge of a parasitic capacitor (not shown) generated at a drain node of the second PMOS transistor 501b.

Thus, $I_{SS}$ flows through the ground of the first NMOS transistor 501d, so that a drain voltage of the first NMOS transistor 501d is dropped. Consequently, the drain voltage of the output part 502 is increased and the voltage of the output terminal "out" is increased.

When the output voltage is gradually increased and a difference between a gate voltage of the first PMOS transistor 501a and a gate voltage of the second PMOS transistor 501b is lower than $I_{SS}/g_m$, the slewing operation is finished. Then, a settling operation is carried out during a second period of FIG. 4.

At this point, the switching element 504 is turned on and the compensation capacitive load $C_C$ is again connected to the input part 501a-501e, thereby maintaining a stable settling characteristic.

During a third period of FIG. 4, when the downslewing input voltage is applied, that is, when the gate voltage of the first PMOS transistor 501a is lower than that of the second PMOS transistor 501b by more than $I_{SS}/g_m$, only the first PMOS transistor 501a is turned on, so that $I_{SS}$ flows only through the first PMOS transistor 501a.

Therefore, $I_{SS}$ does not flow through the second NMOS transistor 501e, and $I_{SS}$ does not flow through the first NMOS transistor 501d, which has a mirror relationship with the second NMOS transistor 501e.

Like the upslewing operation, when the downslewing input voltage is applied, the switching element 504 of the slew rate increasing part is turned off, so that the compensation capacitive load $C_C$ is disconnected from the switching element 504.

Because the magnitude of the current biased through the current source 503 to the output part 502 is fixed to $I_P$, $I_{SS}$ transferred through the first PMOS transistor 501a is supplied to the parasitic capacitor (not shown) generated at the drain node of the second PMOS transistor 501b.

Therefore, the drain voltage of the first NMOS transistor 501d is increased. Consequently, the drain voltage of the output part 502 is dropped and the voltage of the output terminal "out" is dropped.

When the output voltage is gradually dropped and a difference between the gate voltage of the first PMOS transistor 501a and the gate voltage of the second PMOS transistor 501b is lower than $I_{SS}/g_m$, the slewing operation is finished. Then, a settling operation is carried out during a fourth period of FIG. 4.

At this point, the switching element 504 is turned on and the compensation capacitive load $C_C$ is again connected to the input part 501a-501e, thereby maintaining a stable settling characteristic.

In this embodiment, the capacitance of the parasitic capacitor is generally in a range from a few fF to a few tens fF, and the capacitance of the compensation capacitive load $C_C$ is a few pF. Therefore, the slew rate can be improved by about 1,000 times compared with the related art in which only the compensation capacitive load $C_C$ is used. If the slew rates are identical to each other, the power consumption can be reduced by about 1,000 times compared with the related art. This can be verified from Equation (1) above.

Embodiment 2

Referring to FIG. 6, the output buffer circuit according to the second embodiment of the present invention includes an input part 601a-601f, an output part 604a-604b, a floating current source 602a-602d, a summing circuit 603a-603h, and a slew rate increasing part 606.

The input part 601a-601f has two input terminals receiving differential input voltage signals Vin⁺ and Vin⁻. The input part 601a-601f includes: a first NMOS transistor 601a and a first PMOS transistor 601c having a common node connected to the first input terminal to which the differential input voltage Vin⁺ is applied; a second NMOS transistor 601b and a second PMOS transistor 601d having a common node connected to the second input terminal to which the differential input voltage Vin⁻ is applied; a third NMOS transistor 601e biasing the first and second NMOS transistors 601a and 601b; and a third PMOS transistor 601f biasing the first and second PMOS transistors 601c and 601d.

The differential input voltage means a difference between voltages applied to the two input terminals. The output buffer circuit according to the second embodiment of the present invention employs a differential input circuit scheme that operates only in response to the difference between the voltages applied to the two input terminals.

As illustrated in FIG. 6, because the input part 601a-601f is implemented with the NMOS transistors and the PMOS transistors, the voltages of all range from the ground voltage to the power supply voltage VDD can be secured as the input/output voltages. The input part that can secure the voltages of all ranges from the ground voltage to the power supply voltage VDD as the input/output voltages is called a "rail-to-rail" input part. Therefore, a folded cascode operational amplifier having the rail-to-rail input part is preferably used as the output buffer according to the invention.

The output part 604a-604b increases a gain of the differential input voltages Vin⁺ and Vin⁻. The output part 604a-604b may use several kinds of the output terminals, such as a class A type output terminal, a class B type output terminal, and a class AB type output terminal. Among them, it is preferable to use the class AB type output terminal that can secure linearity somewhat.

The floating current source 602a-602d biases the output part 604a-604b. The summing circuit 603a-603h is connected to the input part 601a-601f, the floating current source 502a-502d, and the output part 604a-604b. The summing circuit 603a-603h sums a current supplied from the input part 601a-601f and an internal current supplied from the floating current source 602a-602d.

The slew rate increasing part 606 is connected to the input part 601a-601f and the summing circuit 603a-603h and is implemented with a plurality of switching elements 606. The slew rate increasing part 606 increases a slew rate of the output buffer circuit.

The switching element 606 may be implemented using various elements. Among them, a transistor is widely used as the switching element 606.

To minimize an amount of current in a normal state, Vb1 and Vb2 are set such that the bias voltage of the output part 604a-604b becomes VDD-|VTHP| and VTHN, respectively, where VTHN is a thermal voltage of the NMOS transistor and VTHP is a thermal voltage of the PMOS transistor.

A slewing operation of the output buffer circuit according to the second embodiment of the present invention will be described below with reference to FIGS. 4 and 6.

First, the upslewing operation of the output buffer circuit will be described. It will be assumed that $I_{SS}$ is a bias current of the input part 601a-601f, $I_P$ is a current that is biased through the floating current source 602a-602d to the output part 604a-604b, and $g_m$ is a mutual conductance of a MOS transistor.

During the upslewing operation (a first period of FIG. 4), that is, when gate voltages of the first NMOS transistor 601a and the first PMOS transistor 601c are higher than those of the second NMOS transistor 601b and the second PMOS transistor 601d by more than $I_{SS}/g_m$, only the first NMOS transistor 601a and the second PMOS transistor 601d are turned on, so that $I_{SS}$ flows only through the first NMOS transistor 601a and the second PMOS transistor 601d.

Furthermore, during the upslewing operation, the switching element 504 of the slew rate increasing part is turned off and the compensation capacitive load $C_C$ is disconnected from the switching element 504. Consequently, only the parasitic capacitor (not shown) can be seen from a source node of the second PMOS transistor 603d.

Moreover, the magnitude of the current biased through the floating current source 602a-602d to the class AB output terminals 604a and 604b is fixed to $I_P$, so that $I_{SS}$ is supplied only through the parasitic capacitor.

A source voltage of the sixth PMOS transistor 603d is dropped until $I_{SS}$ is fully supplied from the parasitic capacitor. In addition, a gate voltage of the seventh PMOS transistor 604a is also dropped. Consequently, the fourth PMOS transistor 602c is turned off, so that $I_P$ flows only through the fourth NMOS transistor 602d. At this point, the gate voltage of the seventh PMOS transistor 604a is dropped to Vb2−VTHN and the output voltage Vout is increased.

As described above, during the upslewing operation, only the parasitic capacitor is seen at the source node of the sixth PMOS transistor 603d by the turn-off operation of the switching element 606. Therefore, $I_{SS}$ is discharged through the parasitic capacitor having a very small capacitance (about 1,000 times) compared with the compensation capacitive load $C_C$.

Next, the downslewing operation of the output buffer circuit will be described.

Like the upslewing operation, It will be assumed that $I_{SS}$ is a bias current of the input part 601a-601f, $I_P$ is a current that is biased through the floating current source 602a-602d to the output part 604a-604b, and $g_m$ is a mutual conductance of a MOS transistor.

During the downslewing operation (a third period of FIG. 4), that is, when gate voltages of the first NMOS transistor 601a and the first PMOS transistor 601c are lower than those of the second NMOS transistor 601b and the second PMOS transistor 601d by more than $I_{SS}/g_m$, only the first PMOS transistor 601c and the second NMOS transistor 601b are turned on, so that $I_{SS}$ flows only through the first PMOS transistor 601c and the second NMOS transistor 601d.

Furthermore, like the downslewing operation, the switching element 606 of the slew rate increasing part is turned off and the compensation capacitive load $C_C$ is disconnected from the source node of the sixth NMOS transistor 603h. Consequently, only the parasitic capacitor (not shown) is seen from the source node of the sixth NMOS transistor 603h.

Moreover, the magnitude of the current biased through the floating current source 602a-602d to the class AB output terminals 604a and 604b is fixed to $I_P$, so that $I_{SS}$ is charged only through the parasitic capacitor.

The source voltage of the sixth NMOS transistor 603h is increased until $I_{SS}$ is fully charged to the parasitic capacitor. In addition, the gate voltage of the seventh NMOS transistor 604b is also increased. Consequently, the fourth NMOS transistor 602d is turned off, so that $I_P$ flows only through the fourth PMOS transistor 602c. At this point, the gate voltage of the seventh NMOS transistor 604b is increased up to Vb1−|VTHP| and the output voltage Vout is dropped.

Like the upslewing operation, during the settling operation (a fourth period of FIG. 4), the switching element 606 is turned on and the compensation capacitive load $C_C$ is again connected to the source node of the sixth NMOS transistor 603h, thus maintaining a stable settling characteristic.

As described above, during the downslewing operation, only the parasitic capacitor is seen at the source node of the sixth NMOS transistor 603h by the turn-off operation of the switching element 606. Therefore, $I_{SS}$ is charged through the parasitic capacitor having a very small capacitance compared with the compensation capacitive load $C_C$.

In this embodiment, the capacitance of the parasitic capacitor is generally in a range from a few fF to a few tens fF and the capacitance of the compensation capacitive load $C_C$ is a few pF. Therefore, the slew rate can be improved by about 1,000 times compared with the related art in which only the compensation capacitive load $C_C$ is used. If the slew rates are identical to each other, the power consumption can be reduced by about 1,000 times compared with the related art. This can be verified from Equation (1) above.

As described above, the output buffer circuit according to the present invention can obtain the output voltage having the high slew rate by adding the slew rate increasing part implemented with the switching element(s), making it possible to process data at a high speed.

In addition, the output buffer circuit according to the present invention can obtain the output voltage having the high slew rate even though a smaller amount of the bias current than that required in a conventional output buffer is used. Therefore, the output buffer circuit can reduce power consumption.

Moreover, the output buffer circuit according to the present invention can be easily implemented because only the slew rate increasing part with a small number of switching elements needs to be added thereto.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An output buffer circuit with a compensation capacitive load, comprising:
   an input part having two input terminal receiving differential input voltage signals;
   an output part increasing a gain of the differential input voltages;
   a current source biasing the output part; and
   a slew rate increasing part connected to the output part and the compensation capacitive load, the slew rate increasing part including a switching element to be turned off so as to increase a slew rate of the output buffer circuit when upslewing or downslewing differential input voltages are received;
   wherein the differential input voltages are settling differential input voltages; and
   wherein the slew rate increasing part turns on the switching element when the settling differential input voltages are received.

2. An output buffer circuit with a compensation capacitive load, comprising:
   an input part having two input terminals receiving differential input voltage signals;
   an output part increasing a gain of the differential input voltages;
   a floating current source biasing the output part;
   a summing circuit connected to the input part and the floating current source, the summing circuit being configured to sum a current supplied from the input part and an internal current supplied from the floating current source; and
   a slew rate increasing part connected to the input part and the summing circuit, the slew rate increasing part including a plurality of switching elements to increase a slew rate of the output buffer circuit.

3. The output buffer circuit according to claim 2, wherein the differential input voltages are upslewing differential input voltages.

4. The output buffer circuit according to claim 3, wherein the input part includes:
   first and second NMOS transistors having gates receiving the upsiewing differential input voltages;
   first and second PMOS transistors having gates receiving the upslewing differential input voltages;
   a third NMOS transistor biasing the first and second NMOS transistors; and
   a third PMOS transistor biasing the first and second PMOS transistors.

5. The output buffer circuit according to claim 3, wherein the slew rate increasing part turns off the switching element when the upsiewing differential input voltages are received.

6. The output buffer circuit according to claim 4, wherein the first NMOS transistor and the second PMOS transistor are turned on, and the first PMOS transistor and the second NMOS transistor are turned off.

7. The output buffer circuit according to claim 2, wherein the differential input voltages are downslewing differential input voltages.

8. The output buffer circuit according to claim 7, wherein the input part includes:
   first and second NMOS transistors having gates receiving the downslewing differential input voltages;
   first and second PMOS transistors having gates receiving the downslewing differential input voltages;
   a third NMOS transistor biasing the first and second NMOS transistors; and a third PMOS transistor biasing the first and second PMOS transistors.

9. The output buffer circuit according to claim 7,
wherein the slew rate increasing part turns off the switching element when the downslewing differential input voltages are received.

10. The output buffer circuit according to claim 8,
wherein the first PMOS transistor and the second NMOS transistor are turned on, and the first NMOS transistor and the second PMOS transistor are turned off.

11. The output buffer circuit according to claim 2,
wherein the differential input voltages are settling differential input voltages.

12. The output buffer circuit according to claim 11,
wherein the slew rate increasing part turns on the switching element when the settling differential input voltages are received.

* * * * *